United States Patent
Bichpuriya et al.

(10) Patent No.: US 11,409,925 B2
(45) Date of Patent: Aug. 9, 2022

(54) SYSTEMS AND METHODS FOR SIMULATION OF ELECTRICITY VALUE ECOSYSTEM USING AGENT BASED MODELING APPROACH

(71) Applicant: Tata Consultancy Services Limited, Mumbai (IN)

(72) Inventors: Yogesh Kumar Bichpuriya, Pune (IN); Venkatesh Sarangan, Chennai (IN); Sivaramakrishnan Chandrasekaran, Chennai (IN); Narayanan Rajagopal, Bangalore (IN); Nilesh Sadashiv Hiremath, Pune (IN); Vinodhkanna Jayaraman, Chennai (IN)

(73) Assignee: Tata Consultancy Services Limited, Mumbai (IN)

( * ) Notice: Subject to any disclaimer, the term of this patent is extended or adjusted under 35 U.S.C. 154(b) by 268 days.

(21) Appl. No.: 16/843,031

(22) Filed: Apr. 8, 2020

(65) Prior Publication Data
US 2020/0327265 A1 Oct. 15, 2020

(30) Foreign Application Priority Data
Apr. 12, 2019 (IN) .............................. 201921014883

(51) Int. Cl.
*G06F 30/20* (2020.01)
*G06F 30/27* (2020.01)
(Continued)

(52) U.S. Cl.
CPC .......... *G06F 30/20* (2020.01); *G06F 11/3452* (2013.01); *G06F 11/3466* (2013.01); *G06F 30/27* (2020.01); *G06N 5/003* (2013.01)

(58) Field of Classification Search
CPC .. G06F 30/20; G06F 11/3452; G06F 11/3466; G05B 23/0297; E21B 47/008; G06N 5/003
See application file for complete search history.

(56) References Cited

U.S. PATENT DOCUMENTS 7,401,057 B2 * 7/2008 Eder ...................... G06N 5/022
706/20
9,645,575 B2 * 5/2017 Watson .................. G06N 7/005
(Continued)

OTHER PUBLICATIONS

Macal, C. et al. "Agent-Based Modeling of Electric Power Markets," Proceedings of the 2014 Winter Simulation Conference, Savannah, Georgia, Dec. 7-10, 2014; pp. 276-287.

*Primary Examiner* — Thai Q Phan
(74) *Attorney, Agent, or Firm* — Finnegan, Henderson, Farabow, Garrett & Dunner LLP

(57) ABSTRACT

This disclosure relates to methods and systems for simulation of electricity value ecosystem using agent based modeling approach. State-of-the-art methods utilize simulation tools to support decision making that do not model agents own behaviour and its response to other agents based on an interaction, thereby unable to analyse complex interactions in the electricity value ecosystem. The present disclosure provides a generalized integrated simulation platform which provides dynamic configurability to simulate a plurality of user requirements associated with the electricity value ecosystem using a causal diagram which is further used to identify a plurality of agents. Further, a plurality of a plurality of models and processes for the plurality of agents are determined or generated based on their availability in a repository. The causal diagram is refined in accordance with one or more constraints which supports in making a better and informed decision considering changing dynamics of the plurality of agents.

12 Claims, 16 Drawing Sheets

(51) Int. Cl.
 *G06F 11/34* (2006.01)
 *G06N 5/00* (2006.01)

(56) References Cited

U.S. PATENT DOCUMENTS

| | | |
|---|---|---|
| 2005/0234696 A1 | 10/2005 | North et al. |
| 2012/0330869 A1* | 12/2012 | Durham ................ G06N 5/022 706/16 |
| 2014/0122177 A1 | 5/2014 | Lai et al. |
| 2015/0148919 A1* | 5/2015 | Watson .............. G05B 23/0297 700/31 |
| 2017/0235284 A1* | 8/2017 | Watson .............. G05B 23/0297 700/31 |
| 2017/0279660 A1* | 9/2017 | Muntés-Mulero ...... H04L 41/12 |
| 2019/0108196 A1* | 4/2019 | Hannu ................. G06K 9/6256 |
| 2020/0042426 A1* | 2/2020 | Ambichl ............. G06F 11/3466 |
| 2020/0201267 A1* | 6/2020 | Watson ................ E21B 47/008 |
| 2020/0357504 A1* | 11/2020 | Miyajima .............. G16H 20/70 |
| 2020/0371893 A1* | 11/2020 | Bhorkar ............... G06F 9/5044 |
| 2022/0012591 A1* | 1/2022 | Dalli ....................... G06F 17/18 |

\* cited by examiner

| Market List | Ecosystem Players | Generator Details | | | |
|---|---|---|---|---|---|
| France Market | Generator | Generator Name<br>WindGen | Generator ID<br>WindGen | | |
| | Other Generator | Capacity (MW)<br>78 | Fixed Cost (€/h)<br>27.62 | Variable Cost (€/MWh)<br>2.37 | |
| | System operator | Technology<br>Wind | Location<br>Paris, France | | |
| | Market operator | | | | |
| | Retailer | Bidding model | | Renewable forecasting model | |
| | | Wind BAU 16 | WindGen bid model 1 | DLM 11 | DLM 11 |
| | | Wind BAU 16 | WindGen bid model 1 | DLM 11 | DLM 11 |
| | | View model | View model | View model | View model |
| | | WG BAU 02 | WG BAU 03 | WindGen DLM 03 | DLM 11 |

FIG.5B

SYSTEMS AND METHODS FOR SIMULATION OF ELECTRICITY VALUE ECOSYSTEM USING AGENT BASED MODELING APPROACH

PRIORITY CLAIM

This U.S. patent application claims priority under 35 U.S.C. § 119 to: India Application No. 201921014883, filed on Apr. 12, 2019. The entire contents of the aforementioned application are incorporated herein by reference.

TECHNICAL FIELD

The disclosure herein generally relates to field of simulation of the electricity value ecosystem, more particularly, to methods and systems for simulation of electricity value ecosystem using agent based modeling approach.

BACKGROUND

With advent of technology in electricity market, electricity grids have evolved through smart grid and heading to become resilient grid in the next generation utilities. This requires an active participation from all stakeholders across electricity value chain including generators to end customers or prosumers who are further treated as agents reacting to the electricity grid and market dynamics. The electricity value eco-system is a complex system which includes many physical assets like multiple generators of different technologies, network of wires/cables at different voltage levels, substations, loads of different categories like residential, commercial, industrial. The electricity value ecosystem also comprises agents, who own and operate these assets such as generating company, system operator, market operator, retailers, and the like according to defined structure in a geography or region. However, in a new emerging environment, where new assets, technology, goals of agents keep on changing, it is very difficult to make decisions with growing uncertainty and complexity. Furthermore, structure of the electricity value eco-system especially in context of agents interaction and processes vary from one geography to another Conventional systems utilize simulation tools to support decision making that do not model agents own behaviour and its response to other agents based on an interaction. Further, traditional systems do not fully leverage volumes of data generated due to high usage of technology. Stakeholders associated with electricity value chain are not able to un-lock full potential of their investments in technologies of various planning and simulation models, as they run in silos with limited usage of new age data.

SUMMARY

Embodiments of the present disclosure present technological improvements as solutions to one or more of the above-mentioned technical problems recognized by the inventors in conventional systems. In an aspect, there is provided a processor implemented method, the method comprising: providing a user interface to generate a causal diagram for a received user requirement of an electricity value ecosystem; identifying a plurality of agents in the causal diagram, wherein the plurality of agents comprise a primary agent and one or more secondary agents interconnected with a plurality of edges to depict interdependencies between the plurality of agents; performing at least one of: (a) determining, using an agent based modeling approach, a plurality of processes associated with the plurality of edges and a plurality of models and processes for the plurality of agents, if corresponding models are present in a repository; or (b) generating one or more models if the corresponding models are absent in the repository, wherein the one or more models are generated based on dependencies and interactions of corresponding agent with other agents present in the causal diagram; refining the causal diagram to vary one or more properties associated with the plurality of agents in accordance with one or more constraints. In accordance with an embodiment of the present disclosure, the one or more constraints for refining the causal diagram include geography, market, network of interest or combinations thereof.

In an embodiment, the method further comprising executing the plurality of processes associated with the refined causal diagram to provide a first set of outputs in accordance with the user requirement using default values of the one or more properties of the plurality of agents, wherein the default values of the one or more properties of the plurality of agents in the refined causal diagram are configurable to execute the plurality of processes in accordance with the configured values to provide a second set of outputs capturing cascading effect of impact of variation in the default values of the one or more properties of the plurality of agents. In accordance with an embodiment of the present disclosure, one or more steps of each process associated with both of (i) the plurality of agents and (ii) the plurality of edges are executed in accordance with one or more pre-defined analytical tools. In accordance with an embodiment of the present disclosure, the impact of variation in the default values of the one or more properties of the plurality of agents is determined based on a topological sorted list of the plurality of agents identified in the refined causal diagram.

In another aspect, there is provided a system, the system comprising: one or more data storage devices operatively coupled to one or more hardware processors and configured to store instructions configured for execution via the one or more hardware processors to: provide a user interface to generate a causal diagram for a received user requirement of an electricity value ecosystem; identify a plurality of agents in the causal diagram, wherein the plurality of agents comprise a primary agent and one or more secondary agents interconnected with a plurality of edges to depict interdependencies between the plurality of agents; perform at least one of: (a) determining, using an agent based modeling approach, a plurality of processes associated with the plurality of edges and a plurality of models and processes for the plurality of agents, if corresponding models are present in a repository; or (b) generating one or more models if the corresponding models are absent in the repository, wherein the one or more models are generated based on dependencies and interactions of corresponding agent with other agents present in the causal diagram; refine the causal diagram to vary one or more properties associated with the plurality of agents in accordance with one or more constraints. In accordance with an embodiment of the present disclosure, the one or more constraints for refining the causal diagram include geography, market, network of interest, or combinations thereof.

In an embodiment, the one or more processors are further configured to execute the plurality of processes associated with the refined causal diagram to provide a first set of outputs in accordance with the user requirement using default values of the one or more properties of the plurality of agents, wherein the default values of the one or more properties of the plurality of agents in the refined causal diagram are configurable to execute the plurality of processes in accordance with the configured values to provide a second set of outputs capturing cascading effect of impact of variation in the default values of the one or more properties of the plurality of agents. In accordance with an embodiment of the present disclosure, one or more steps of each process associated with both of (i) the plurality of agents and (ii) the plurality of edges are executed in accordance with one or more predefined analytical tools. In accordance with an embodiment of the present disclosure, the impact of variation in the default values of the one or more properties of the plurality of agents is determined based on a topological sorted list of the plurality of agents identified in the refined causal diagram.

In yet another aspect, there is provided a computer program product comprising a non-transitory computer readable medium having a computer readable program embodied therein, wherein the computer readable program, when executed on a computing device, causes the computing device to: provide a user interface to generate a causal diagram for a received user requirement of an electricity value ecosystem; identify a plurality of agents in the causal diagram, wherein the plurality of agents comprise a primary agent and one or more secondary agents interconnected with a plurality of edges to depict interdependencies between the plurality of agents; perform at least one of: (a) determining, using an agent based modeling approach, a plurality of processes associated with the plurality of edges and a plurality of models and processes for the plurality of agents, if corresponding models are present in a repository; or (b) generating one or more models if the corresponding models are absent in the repository, wherein the one or more models are generated based on dependencies and interactions of corresponding agent with other agents present in the causal diagram; refine the causal diagram to vary one or more properties associated with the plurality of agents in accordance with one or more constraints. In accordance with an embodiment of the present disclosure, the one or more constraints for refining the causal diagram include geography, market, network of interest or combinations thereof.

In an embodiment, the computer readable program, when executed on the computing device, further causes the computing device to execute the plurality of processes associated with the refined causal diagram to provide a first set of outputs in accordance with the user requirement using default values of the one or more properties of the plurality of agents, wherein the default values of the one or more properties of the plurality of agents in the refined causal diagram are configurable to execute the plurality of processes in accordance with the configured values to provide a second set of outputs capturing cascading effect of impact of variation in the default values of the one or more properties of the plurality of agents. In accordance with an embodiment of the present disclosure, one or more steps of each process associated with both of (i) the plurality of agents and (ii) the plurality of edges are executed in accordance with one or more predefined analytical tools. In accordance with an embodiment of the present disclosure, the impact of variation in the default values of the one or more properties of the plurality of agents is determined based on a topological sorted list of the plurality of agents identified in the refined causal diagram.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

FIGS. 5A and 5B show user interface or screen representing inputs and corresponding effects of selecting inputs for simulation of electricity value ecosystem using agent based modeling approach, in accordance with some embodiments of the present disclosure.

Figure 1:
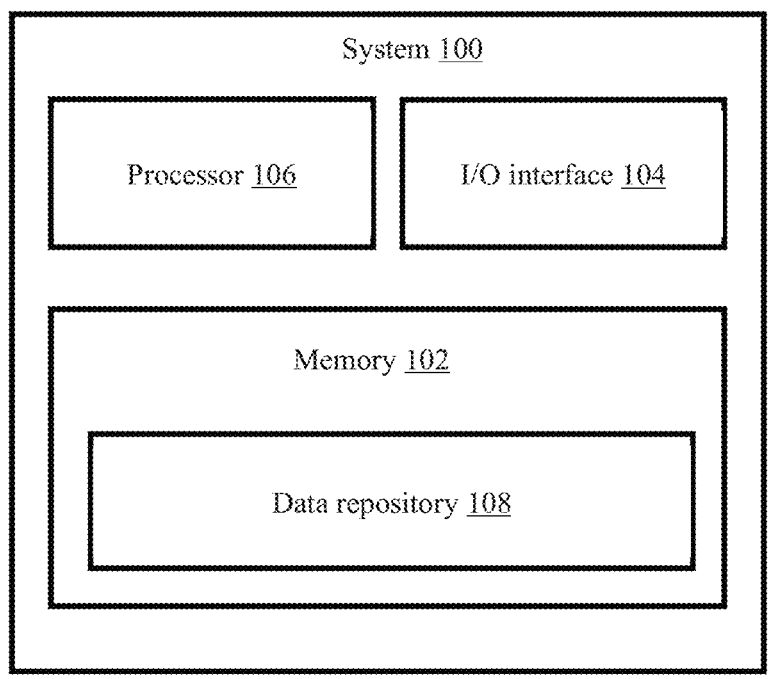
FIG. 1 illustrates a block diagram of a system for simulation of a electricity value ecosystem using agent based modeling approach, in accordance with some embodiments of the present disclosure.

It should be appreciated by those skilled in the art that any block diagrams herein represent conceptual views of illustrative systems and devices embodying the principles of the present subject matter. Similarly, it will be appreciated that any flow charts, flow diagrams, and the like represent various processes which may be substantially represented in computer readable medium and so executed by a computer or processor, whether or not such computer or processor is explicitly shown.

DETAILED DESCRIPTION

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments. It is intended that the following detailed description be considered as exemplary only, with the true scope being indicated by the following claims.

The embodiments herein provide a system and method for simulation of an electricity value ecosystem using agent based modeling approach. The present disclosure provides an integrated modeling and simulation platform, where stakeholders modelled as agents and decision support tools for analytics can be integrated and leveraged. Such an integrated platform enables optimization of entire electricity value chain. Here, the entire electricity value chain includes generation, transmission, distribution, markets, retail, customer, prosumer and the like. In an embodiment, the system, which presents the integrated platform to a user as workbench, is alternatively referred as Electricity Value Ecosystem Studio (ELVACS) and hereby used interchangeably throughout the description. Further, behavioral modeling of the agents is performed which extends the ELVACS to model the electricity value ecosystem. The ELVACS provides a flexible studio that models stakeholders in the electricity value ecosystem and underlying framework of network infrastructure, market and regulatory mechanisms to study complex interactions across the electricity value chain and support decision making process. The integrated platform enables generating deep and broad insights on the electricity value ecosystem for strategy planning and decision making. The ELVACS enables the stakeholders to analyze and to make decisions considering What-if scenarios. Thus, the method of present disclosure provides a generalized software framework which can simulate various use-cases of the electricity value eco-system which can be customized for a relevant geography and helps user to make a better and informed decision, while considering the dynamics of other agents. Further, the method of present disclosure considers one or more aspects of entire electricity value chain such as market, optimization, control, stability, power quality and reliability and the like.

Referring now to the drawings, and more particularly to FIG. 1 through FIG. 9B, where similar reference characters denote corresponding features consistently throughout the figures, there are shown preferred embodiments and these embodiments are described in the context of the following exemplary system and/or method.

FIG. 1 illustrates a block diagram of a system 100 for simulation of the electricity value ecosystem using agent based modeling approach, in accordance with an example embodiment of the present subject. In an embodiment, the system 100 includes one or more processors 106, communication interface device(s) or input/output (I/O) interface(s) 104, and one or more data storage devices or memory 102 operatively coupled to the one or more processors 106. The one or more processors 106 that are hardware processors can be implemented as one or more microprocessors, microcomputers, microcontrollers, digital signal processors, central processing units, state machines, graphics controllers, logic circuitries, and/or any devices that manipulate signals based on operational instructions. Among other capabilities, the processor(s) are configured to fetch and execute computer-readable instructions stored in the memory. In the context of the present disclosure, the expressions 'processors' and 'hardware processors' may be used interchangeably. In an embodiment, the system 100 can be implemented in a variety of computing systems, such as laptop computers, notebooks, hand-held devices, workstations, mainframe computers, servers, a network cloud and the like. In an embodiment, the processor 106, the I/O interface 104, and the memory 102, may be coupled by a system bus.

The I/O interface 104 may include a variety of software and hardware interfaces, for example, a web interface, a graphical user interface, and the like. The interfaces 104 may include a variety of software and hardware interfaces, for example, interfaces for peripheral device(s), such as a keyboard, a mouse, an external memory, a camera device, and a printer. The interfaces 104 can facilitate multiple communications within a wide variety of networks and protocol types, including wired networks, for example, local area network (LAN), cable, etc., and wireless networks, such as Wireless LAN (WLAN), cellular, or satellite. For the purpose, the interfaces 104 may include one or more ports for connecting a number of computing systems with one another or to another server computer. The I/O interface 104 may include one or more ports for connecting a number of devices to one another or to another server.

The memory 102 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. In an embodiment, one or more modules (not shown) of the system 100 can be stored in the memory 102. The one or more modules (not shown) of the system 100 stored in the memory 102 may include routines, programs, objects, components, data structures, and so on, which perform particular tasks or implement particular (abstract) data types. In an embodiment, the memory 102 includes a data repository 108 for storing data processed, received, and generated as output(s) by the system 100.

The data repository 108, amongst other things, includes a system database and other data. In an embodiment, the data repository 108 may be external (not shown) to the system 100 and accessed through the I/O interfaces 104. The memory 102 may further comprise information pertaining to input(s)/output(s) of each step performed by the processor 106 of the system 100 and methods of the present disclosure. In an embodiment, the system database stores information being processed at each step of the proposed methodology. The other data may include, data generated as a result of the execution of the one or more modules (not shown) of the system 100 stored in the memory 102. The generated data may be further learnt to provide improved learning in the next iterations to output desired results with improved accuracy.

A detailed description of the above-described system for simulation of the electricity value ecosystem using agent based modeling approach is shown with respect to illustrations represented with reference to FIGS. 2 through 9B.

Figure 2:
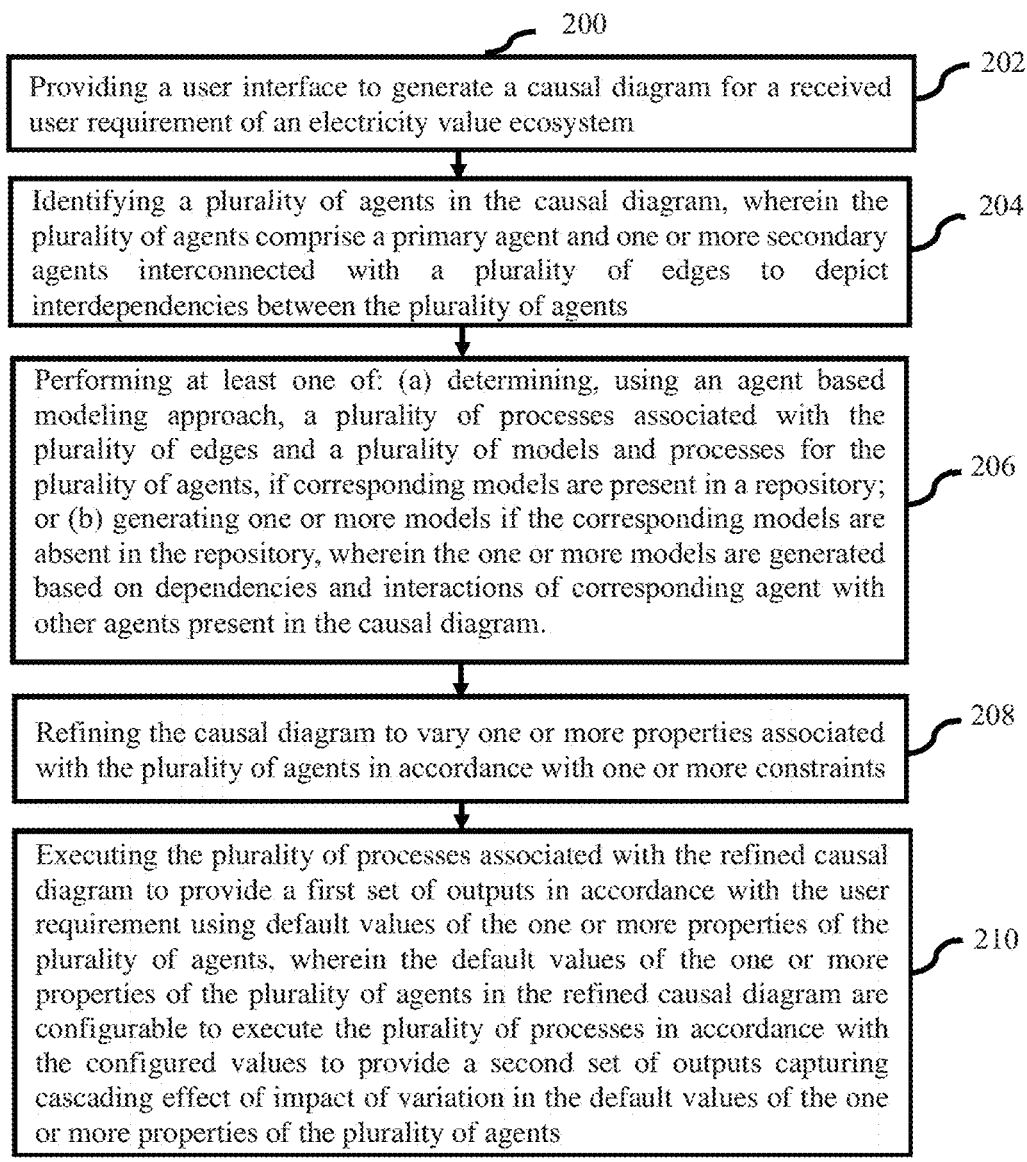
FIG. 2 illustrates an exemplary flow diagram of a processor implemented method for simulation of the electricity value ecosystem using agent based modeling approach, in accordance with some embodiments of the present disclosure.

FIG. 2 illustrate an exemplary flow diagram of a processor implemented method for simulation of the electricity value ecosystem using agent based modeling approach by using the system 100 of FIG. 1, in accordance with an embodiment of the present disclosure. In an embodiment, the system 100 includes one or more data storage devices or memory 102 operatively coupled to the one or more processors 106 and is configured to store instructions configured for execution of steps of the method 200 by the one or more processors 106. The steps of the method 200 will now be explained in detail with reference to the components of the system 100 of FIG. 1. Although process steps, method steps, techniques or the like may be described in a sequential order, such processes, methods and techniques may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

Figure 3:
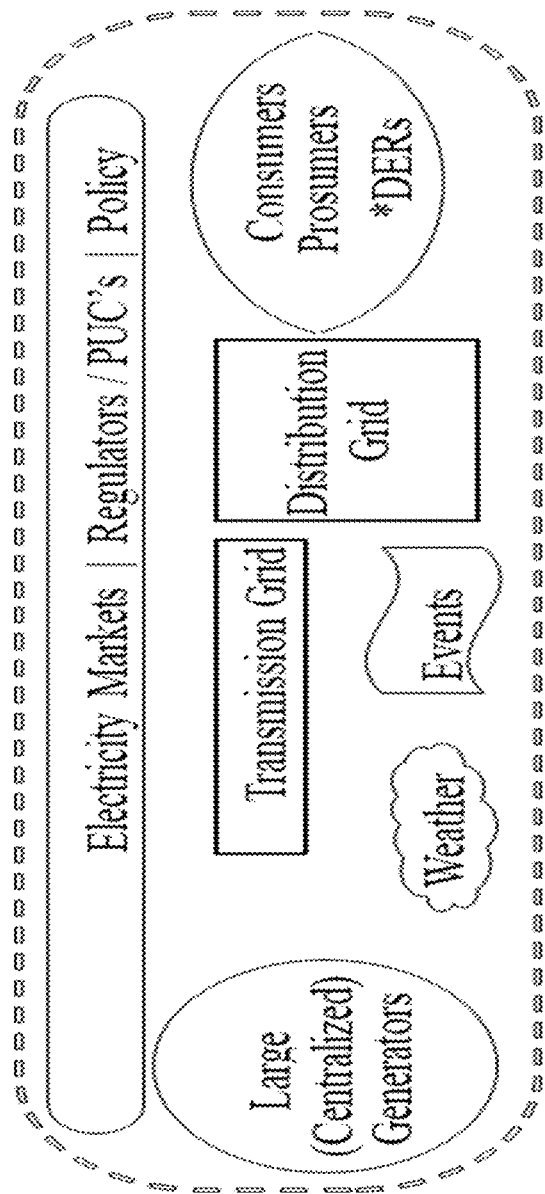
FIG. 3 illustrates one or more examples of the electricity value ecosystem, in accordance with some embodiments of the present disclosure.

In accordance with an embodiment of the present disclosure, the one or more processors 106 are configured to provide, at step 202, a user interface to generate a causal diagram for a received user requirement of the electricity value ecosystem. In an embodiment, one or more examples of the electricity value ecosystem are shown in FIG. 3. As can be seen in FIG. 3, the electricity value ecosystem may comprise large generating units, transmission and distribution networks connecting to consumers and prosumers with distributed energy resources (DERs). Further, interaction between different components such as scheduling of the generators depending on the electricity demand variations and availability transmission corridors of the electricity value ecosystem could be received as user requirements which are further defined by technical characteristics of assets, electricity market rules, regulations and policy defined by regulatory bodies and public utilities commissions (PUC's). In an embodiment, it is observed that architecture of the system of present disclosure is developed in such a way that any new module can be added as 'plug-and-play'. Further, user of the proposed system can be any ecosystem player in electricity value chain from generation to consumption. In an embodiment, an analytics library is defined in the system 100 which covers a set of use cases and stored in the data repository 108. The design of the system 100 allows the end user to define a new use case through the provided user interface. With the help of the provided user interface, the user is able to define his goals, objectives and insights required from simulation. Few examples of the goals, objectives and insights that the user may define from the available multitude of options in the analytic library may include but not limited to optimal bidding strategies to participate in electricity market for both generators and distribution companies, optimal incentive design for demand response, and solar corrected demand forecast.

In the example for optimal bidding strategy, the method disclosed enables the user in optimally placing bids in the electricity market for buying/selling electricity, maximizing profitability and revenue. Further, additional objectives such as utilization of renewables, reduction in emission could be defined as 'user requirements' by the user at the time of simulation.

The electricity market is an example of the electricity value ecosystem. The electricity markets can be of different types including but not limited to future market, day-ahead market, intra-day market, spot market and balancing market. In future market, an agreement is arrived at, between parties with particulars including quantity, quality of product to be delivered, date/duration of agreement, payment date, any penalties if either party fails and the agreed price to be paid. These types of markets are beneficial to trade at a price acceptable to both side and hence provides a way to share price risk. In day-ahead market, trading is done for next day (blocks of defined time interval such as half hourly or hourly), offers/bids are submitted by participants and are accepted under merit order criterion keeping into account the network constraints. Also, purchased energy is used for that the blocks of defined time interval only. In an embodiment, day-ahead market forms a major part of energy transactions. Further, the intra-day market provides participants a possible chance to trade power close to real time (within the same day —hours before start of energy delivery). The intra-day market is a continuous market unlike day-ahead, which is a closed auction type. In intra-day market, bids are set based on a first-come, first-served principle. This market can help increase share of renewable energy sources, since there is more flexibility to correct trading errors. Furthermore, in the spot market, buyer pays for the products they bought immediately or on the spot, with no condition with respect to delivery which means neither of the party can back out of the deal. But, prices in the spot market are dynamic in nature or changes quickly. In an embodiment, a balancing market is explained. If either party fails to deliver/consume the amount of agreed product/energy, then these unbalances are settled at the balancing market (spot, imbalance settlement & ancillary services). Here, parties buy or sell the unbalanced amount at the price provided by the balancing market.

Figure 4:
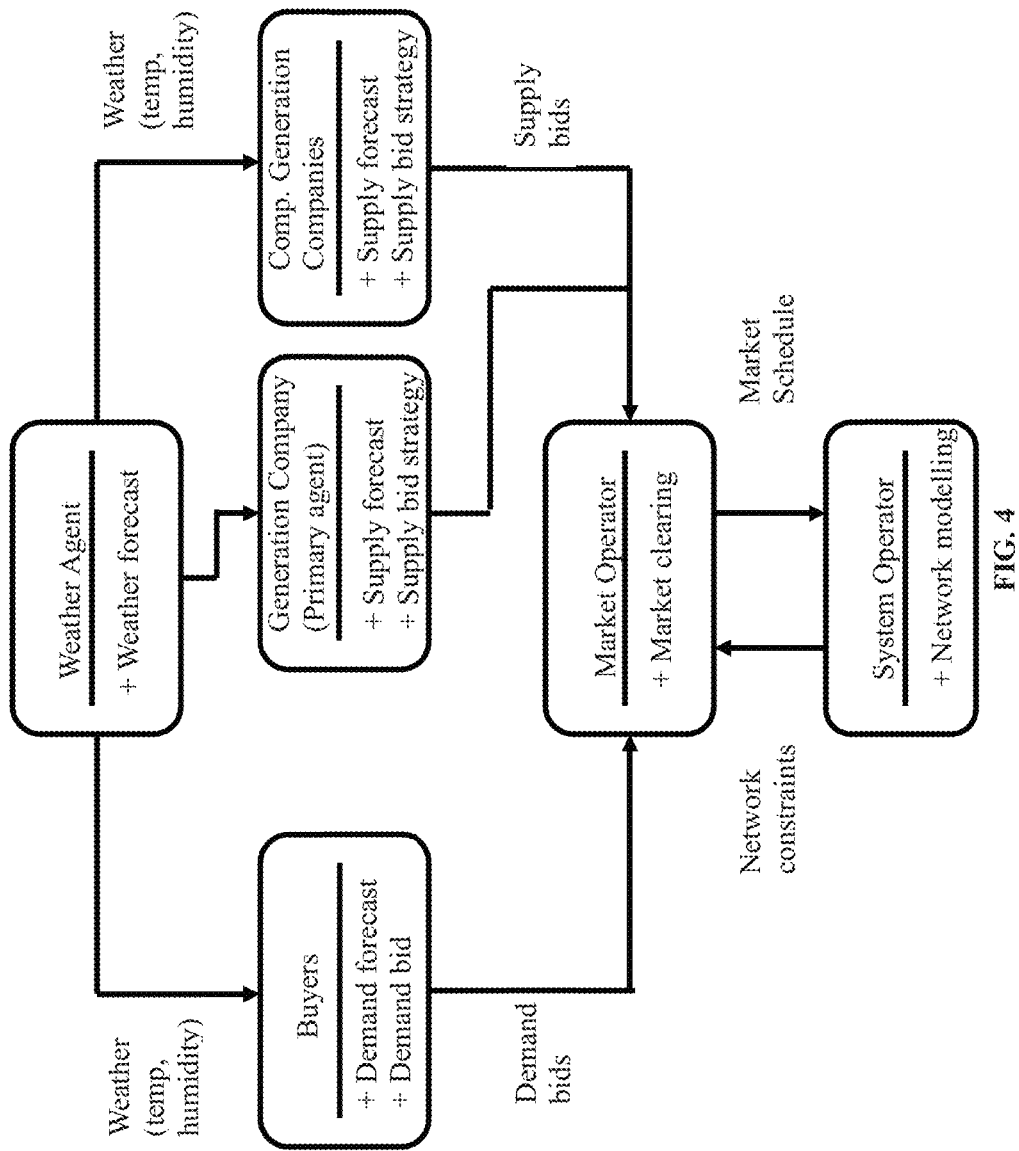
FIG. 4 illustrates a generated causal diagram of electricity market, in accordance with an example embodiment of the present subject.

Further, as an example, a use-case of Optimal Bidding strategy for a generator in an electricity market is considered. The user requirements received for the example use case could be maximizing profit for a problem statement related to placing a bid in the electricity market, wherein the problem statement is "In an electricity market, a generator sells its available generation by submitting single or multiple bids to a market operator. The market operator uses a market mechanism to prepare a schedule for buyers and sellers of electricity considering network and other constraints. Each generator tries to strategize its bids in order to maximize profit. When the generator under consideration takes a decision, the other competitive generators may also respond. It means that not just the generator under consideration is active in the market, but all other agents can also change their behaviour or strategies. This requires simulating all the agents in the relevant eco-system." Thus, a causal diagram is generated by an expert assisting the user (end user), wherein the system 100 or ELVACS enables the expert to drag and drop all the relevant components associated with the electricity value ecosystem on to a work area/work bench of the user interface. FIG. 4 illustrates a generated causal diagram of electricity market, in accordance with an example embodiment of the present disclosure. The FIG. 4 provides the interrelation or dependencies of one agent on other. As depicted, the generation company reviews availability of generation across its assets. Further, the transmission company (alternatively referred as network agent) provides transmission capacity available across main transmission lines. Weather forecast is provided by a third party service or a separate forecasting engine. Buyers generate a demand forecast for different time slots of the next day considering weather and other factors. The buyers submit demand bids based on the demand forecast. The generation company considering all the factors and submits supply bids. The market operator matches the bids and does the clearing and provides schedules to the generation company.

Referring to FIG. 2, the one or more processors 106 are configured to identify, at step 204, a plurality of agents in the causal diagram, wherein the plurality of agents comprise a primary agent and one or more secondary agents interconnected with a plurality of edges to depict interdependencies between the plurality of agents. In an embodiment, a primary agent refers to the agent who optimizes its action by considering possible actions of other agents under different scenarios. All other agents which are being affected by the action of primary agents or can affect action of primary agent are referred as secondary agents. As can be seen in FIG. 4, generation company is identified as a primary agent and other competitive generation companies, system operator, market operator, buyers, and weather are identified as secondary agents. Further, as can be seen in FIG. 4, the primary agent (generation company) and the one or more secondary agents are interconnected with a plurality of edges which are directed edges that indicate the interdependencies or causal relationship between the agents. In an embodiment, the causal relationship indicates that certain properties of an upstream agent (the agent from which the edge originates) affects certain properties of a downstream agent (the agent where the edge terminates).

Further, as depicted in FIG. 2, at step 206, the one or more hardware processors 106 are configured to perform at least one of: (a) determining, using an agent based modeling approach, a plurality of processes associated with the plurality of edges and a plurality of models and processes for the plurality of agents, if corresponding models are present in a repository; or (b) generating one or more models if the corresponding models are absent in the repository. The one or more models are generated based on dependencies and interactions of corresponding agent with other agents present in the causal diagram. In an embodiment, the agent based modeling approach is used for modeling goals, actions and interactions of relevant agents in any ecosystem to simulate a user requirement. In an embodiment, the system 100 disclosed herein comprises a repository of models for the plurality of agents stored in the system database (e.g., the data repository 108). This system database is pre-populated by domain experts who work together with software engineers. For each agent type, there are a list of properties which the end user may need to initialize before running a simulation. Thus, first it is determined if the corresponding models for the plurality of processes associated with the plurality of edges and a plurality of models and processes for the plurality of agents are present in the repository of models stored in the system database. The plurality of models can be modified/updated as required and Machine learning based model can be used which are further trained online to adopt dynamic behaviour of the electricity value eco-system. As can be seen in FIG. 4, demand bids, supply bids, market schedule, network constraints, weather constraints such temperature, humidity and the like are referred as the plurality of processes associated with the plurality of edges. Further, as shown in FIG. 4, demand forecast, demand bid strategy, weather forecast, supply forecast, supply bid strategy, market clearing, and network modelling are referred as the plurality of processes associated with the plurality of agents.

In an embodiment, if the corresponding models for the plurality of processes associated with the plurality of edges and the plurality of models and processes for the plurality of agents are absent in the repository, then one or more models are generated based on dependencies and interactions of corresponding agent with other agents present in the causal diagram. In another embodiment, the one or more models are generated based on assignment of one or more functions to each edge by the end user. In an embodiment, the one or more functions define how exactly value of the downstream agent's properties get affected by value of the upstream agent's properties. The one or more functions take the upstream agent's properties as input parameters and set the values of the downstream agent's properties. In an embodiment, the one or more functions can be user defined or selected from a pre-defined list of functions stored in the data repository 108. In an embodiment, a model from the plurality of models can be called by multiple agents at same time with different set of inputs.

In an embodiment, one or more steps of each process associated with both of (i) the plurality of agents and (ii) the plurality of edges are executed in accordance with one or more predefined analytical tools. In other words, each process is carried out by respective or corresponding agent by following the one or more steps. For example, in process of demand forecasting carried out by the system operator agent, the one or more steps involved include (i) collection of a plurality of data by the system operator agent, wherein the collected data includes historical information of demand, weather, and other exogeneous variables of a region of interest; (ii) preprocessing the collected data for data validation, outlier detection; (iii) performing statistical analysis on the preprocessed data by finding auto and cross correlation to select important input points; (iv) developing a machine learning based forecasting model which is further trained for a given data set; (v) testing the machine learning based forecasting model to evaluate performance of demand forecast; and (vi) utilizing the machine learning based forecasting model for simulation of the user requirement. In an embodiment, the plurality of identified agents, work/collaborate/compete in an environment as depicted in the causal diagram. These agents use different predefined analytical tools to do their individual tasks. Thus, the one or more pre-defined analytical tools are identified, which the plurality of agents should use when simulating the received user requirement. The system 100 of the present disclosure comprises a repository of pre-defined analytical tools stored in the data repository 108 and each agent from the plurality of agents are assigned appropriate analytical tool as desired by the end user to execute the one or more steps of each process. In an embodiment, the one or more analytical tools are developed as software programs and are based on mathematical optimization, statistical models, domain models and machine learning etc. In case, same task appears in two different agents, these two agents can use different pre-defined analytical tools to carry out this task. For example, as shown in FIG. 4, for electricity market ecosystem, the one or more predefined analytical tools assigned to the plurality of agents include (a) weather forecasting tool for the weather agent, (b) demand forecasting tool for the buyer agent, (c) supply forecasting tool for the primary agent and the competition generation agent, (d) supply bid strategy tool for the primary agent and the competition generation agent, (e) market clearing model for the market operator agent, and (f) network model for the system operator agent.

In accordance with an embodiment of the present disclosure, at step 208 of FIG. 2, the one or more processors 106 are configured to refine the causal diagram to vary one or more properties associated with the plurality of agents in accordance with one or more constraints. In an embodiment, the one or more constraints for refining the causal diagram include geography, market, network of interest or combinations thereof. In other words, the performance of the system 100 of the present disclosure may vary with change in one geography to another geography due to change in regulatory and policy frameworks, market and network of interest. Thus, for generating the causal diagram, a particular geography needs to be specified in which the use case has to be executed. For example, it is assumed that the use case is "bidding in whole-sale electricity markets". Then, the electricity market in which use case and the received user requirement are to be simulated need to be specified. For example, it should be specified whether the use case and the received user requirement is executed in Australia, France, India, or USA and the like. For each use-case, the system 100 of the present disclosure comprises a master table created by a team of domain experts in its system database that has values pre-defined for various agent types across different geographies. Once the geography for the use case and the received user requirement is selected, the system 100 of present disclosure looks into a master table comprised in the system database and automatically assigns appropriate values for agent properties which may vary for different geographies for same use case and user requirement. Thus, accordingly, the causal diagram is refined to vary the one or more properties associated with the plurality of agents.

The step of refining the causal diagram, to vary the one or more properties associated with the plurality of agents in accordance with one or more constraints, is further illustrated with the help of an example. For example, for the user requirement "bidding in whole-sale electricity markets", it is assumed that the selected electricity market is Australia's National Electricity Market (NEM). Once NEM has been selected, the system 100 of the present disclosure automatically assigns a property "auction type" for market agent as "single-sided". It also automatically assigns a property "number of price bands in the bid" for the market agent as "10". It also automatically assigns the single sided market clearing model from its repository against property "market clearing module". With reference to FIG. 4, it is identified that the "Demand-side bid forecast" is no longer required and causal diagram is updated accordingly. However, for the same user requirement "bidding in whole-sale electricity markets", the selected geography is changed to electricity market of European Power Exchange (EPEX). Once EPEX has been selected, the system 100 of the present disclosure automatically assigns the property "auction type" for the market agent as "double-sided"; It also automatically assigns the property "number of price bands in the bid" for the market agent as "255". It also automatically assigns the double-sided market clearing model from its repository against the property "market clearing module". However, for this geography, there will be no change in the causal diagram shown in FIG. 4, but properties of the plurality of agents change. Thus, the system 100 of the present disclosure provides a flexibility in adapting solutions to different geography Referring to FIG. 2, at step 210 the one or more processors 106 are configured to execute the plurality of processes associated with the refined causal diagram to provide a first set of outputs in accordance with the user requirement. The first set of outputs is generated in accordance with default values of the one or more properties of the plurality of agents present in the system 100. The default values of the one or more properties of the plurality of agents in the refined causal diagram are configurable to execute the plurality of processes in accordance with the configured values to provide a second set of outputs capturing cascading effect of impact of variation in the default values of the one or more properties of the plurality of agents. In an embodiment, the step of executing the plurality of processes associated with the refined causal diagram to provide the first set of outputs helps in simulating the received user requirement considering different 'what-if' scenarios and generate insights which helps in decision making by the primary agents. For the Optimal Bidding strategy use-case, the user requirement is to maximize the profit by taking an optimal bidding strategy. The output of the simulation is profit values under different demand or weather scenarios. The simulation also provides other useful insights such as revenue, asset utilization and the like.

In an embodiment, the impact of variation in the default values of the one or more properties of the plurality of agents is determined based on a topological sorted list of the plurality of agents identified in the refined causal diagram. In other words, a 'what-if' analysis is performed by changing values of certain parameters or properties in the refined causal diagram. In an embodiment, in certain scenarios, the causal graph can form a directed acyclic graph (DAG). In such cases, the system 100 of present disclosure automatically cascades impact of changing default values in properties of anyone "upstream agent" to all its "downstream agents" without the user having to do anything. The cascading effect of impact of variation is achieved by first constructing a directed graph G=(V, E) that represents the refined causal diagram. Here, set of vertices V in the directed graph corresponds to the plurality of agents present in the refined causal diagram with one vertex for each agent type and edge set E corresponds to the causal relationship or interdependencies between the plurality of agents. Further, a topological sort algorithm is run on the directed graph which outputs a linear ordering of vertices in G such that for every directed edge (U, V) from vertex U to vertex V, U comes before V in the ordering. In other words, this implies that if any default value of property of an agent corresponding to vertex "U" gets changed by the end-user, then potentially all the vertices that appear after "U" in the topological sort can get affected by the change in default value of the property.

In an embodiment, it is assumed that topological sorted list of a causal diagram is $u_1, u_2, u_3, u_4, u_5 \ldots u_n$. Further, if default value of property of an agent corresponding to node $u_2$ is changed, then change in $u_2$ can potentially affect the properties of nodes $u_3, u_4, \ldots$ until $u_n$. In such a case, the system 100 of the present disclosure first determines the changes that happen to $u_3$ because of change to $u_2$. Once the impact of change in $u_2$ on $u_3$ is calculated, then the system 100 of present disclosure determines changes that happen to default values of properties of the agent corresponding to node $u_4$ because of changes to both $u_2$ and $u_3$. In a similar way, after determining the change in default values of properties of agents corresponding to node $u_4$, change in default values of properties of agents corresponding to node u5, because of changes to $u_2$, $u_3$, and $u_4$ is estimated. This process continues until nodes in the entire topological sorted list is processed.

EXPERIMENTAL OBSERVATIONS

Figure 5A:
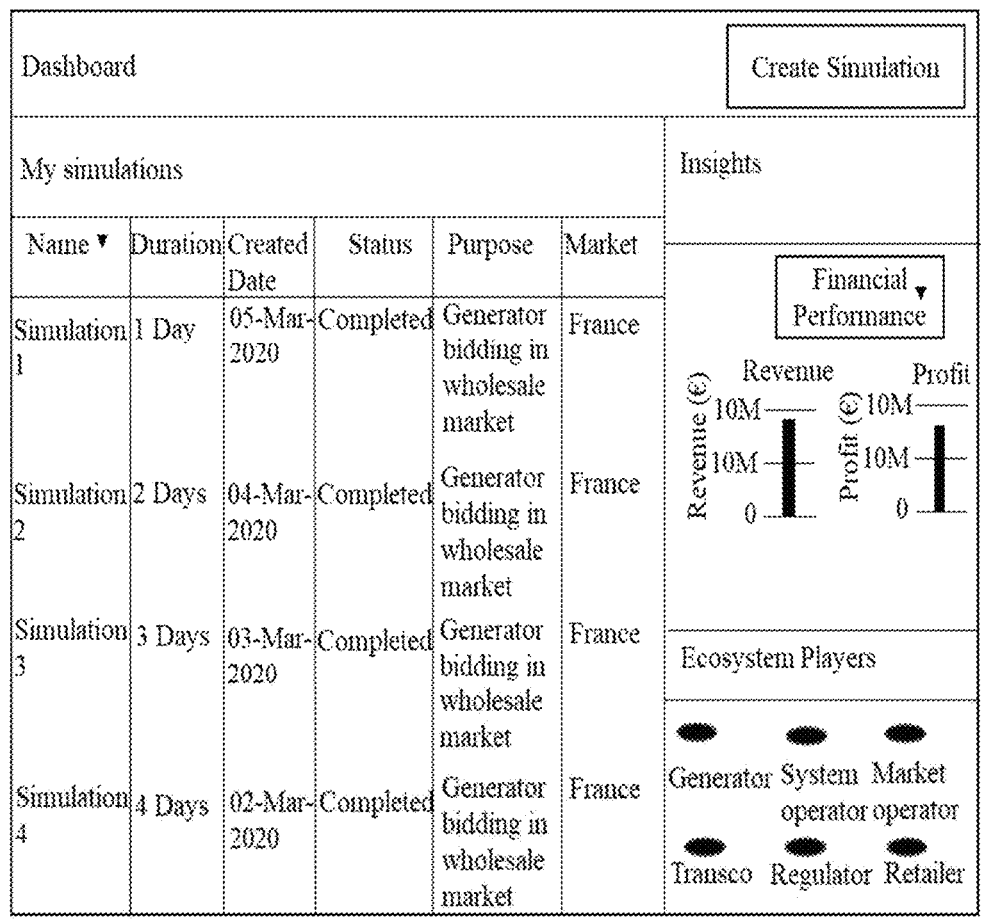
Figure 6A:
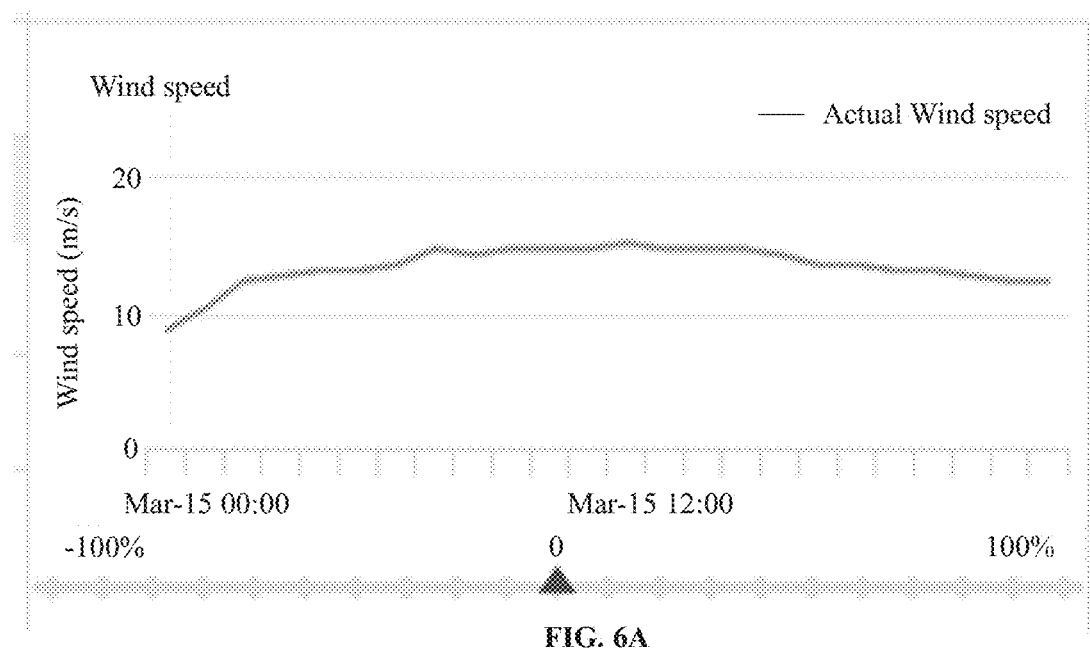
FIGS. 6A through 6D illustrate graphs depicting weather parameters associated with a scenario setting weather variable for simulation of electricity value ecosystem using agent based modeling approach, in accordance with some embodiments of the present disclosure.
Figure 6B:
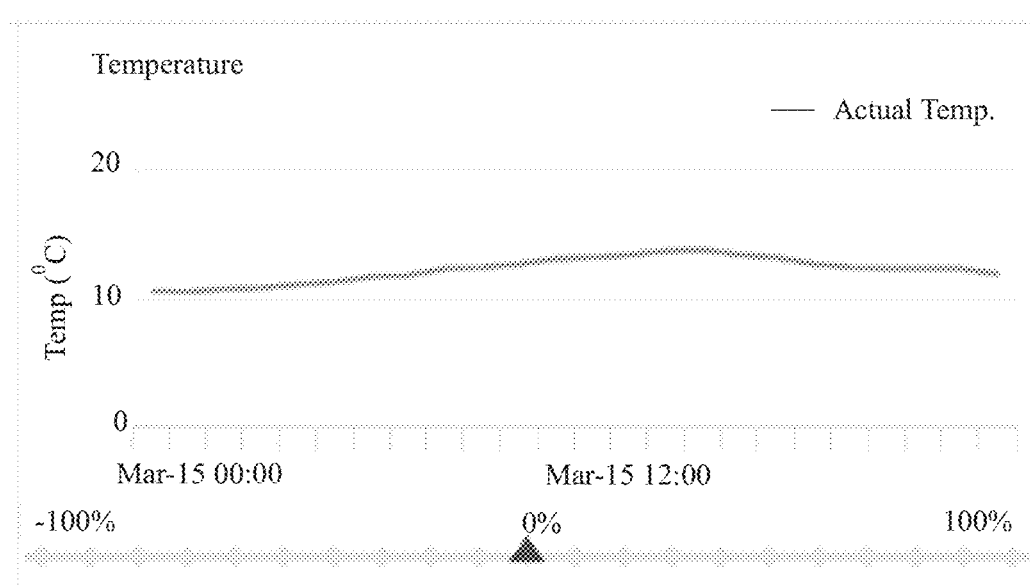
Figure 6C:
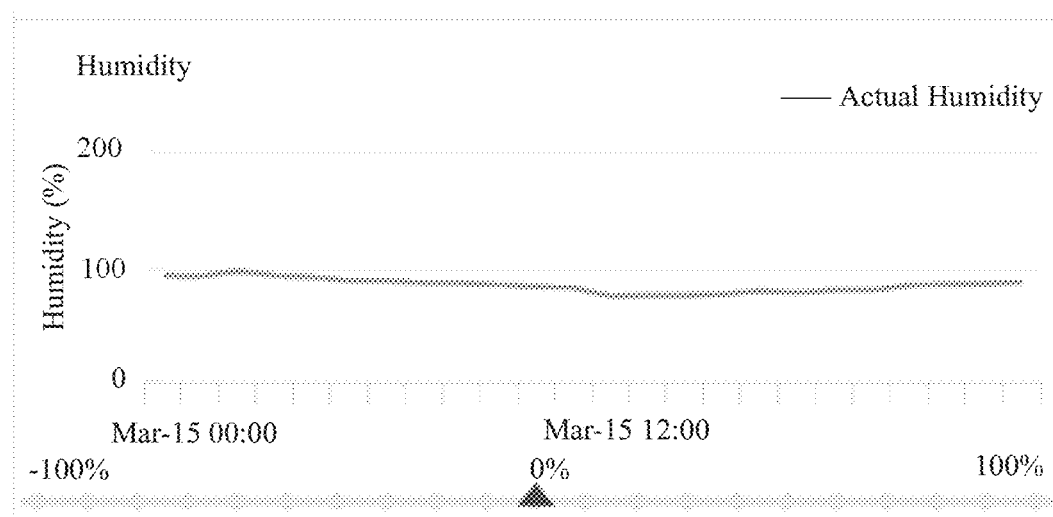
Figure 6D:
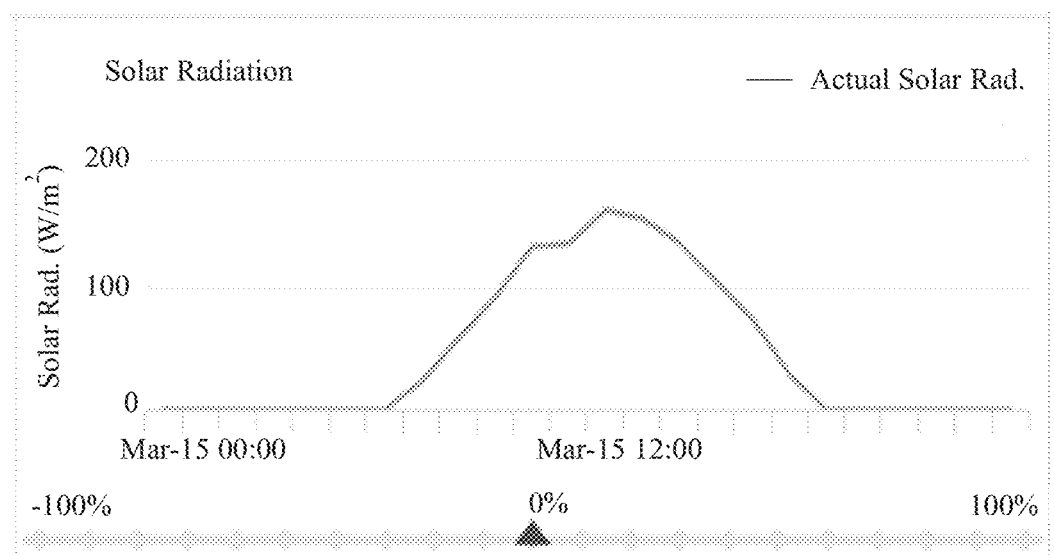

FIGS. 5A and 5B show user interface or screen representing inputs and corresponding effects of selecting inputs for simulation of electricity value ecosystem using agent based modeling approach, in accordance with some embodiments of the present disclosure. As can be seen in FIG. 5A, a screen showing a list of different simulations run with different scenarios is provided. These simulations may differ in time period of simulation, scenarios of demand and weather, analytical models. For example, if same simulation has to be run for a specific time period then, there is an option to configure date. Further, a quick summary of insights from the simulation is also displayed for the user requirement which includes financial performance in terms of revenue and profit. Ecosystem players information as shown in the screen is to display which all agents are relevant for the selected simulation. FIG. 5B illustrates a screen showing details about each of the agents in the electricity market ecosystem. The details may include models/analytics/processes associated with the agents including generator which is a primary agent, other generators, system operator, market operator, and retailer. As can be seen in FIG. 5B, the generator is selected and all the details about the selected generator such as generator name, generator ID, capacity, fixed cost, variable cost, technology, location are provided.

FIGS. 6A through 6D illustrate graphs depicting weather parameters associated with a scenario setting weather variable for simulation of electricity value ecosystem using agent based modeling approach, in accordance with some embodiments of the present disclosure. Here, the weather parameters such as wind speed, temperature, humidity and solar radiation are shown. These plots are time series plots of the weather parameters for a selected time duration of a simulation period. X-axis of these plots represent time of a day. Y-axis represents corresponding weather parameters with unit (e.g., degree Celsius for temperature). Default case represents a base case scenario and the system 100 disclose herein allows an end user to change the base case to create a new scenario with help of a slider or modifying in a table or uploading new data. These weather parameters can impact demand as well as renewable energy generation and hence simulation of the user requirement under various scenarios helps in better decision making.

Figure 7:
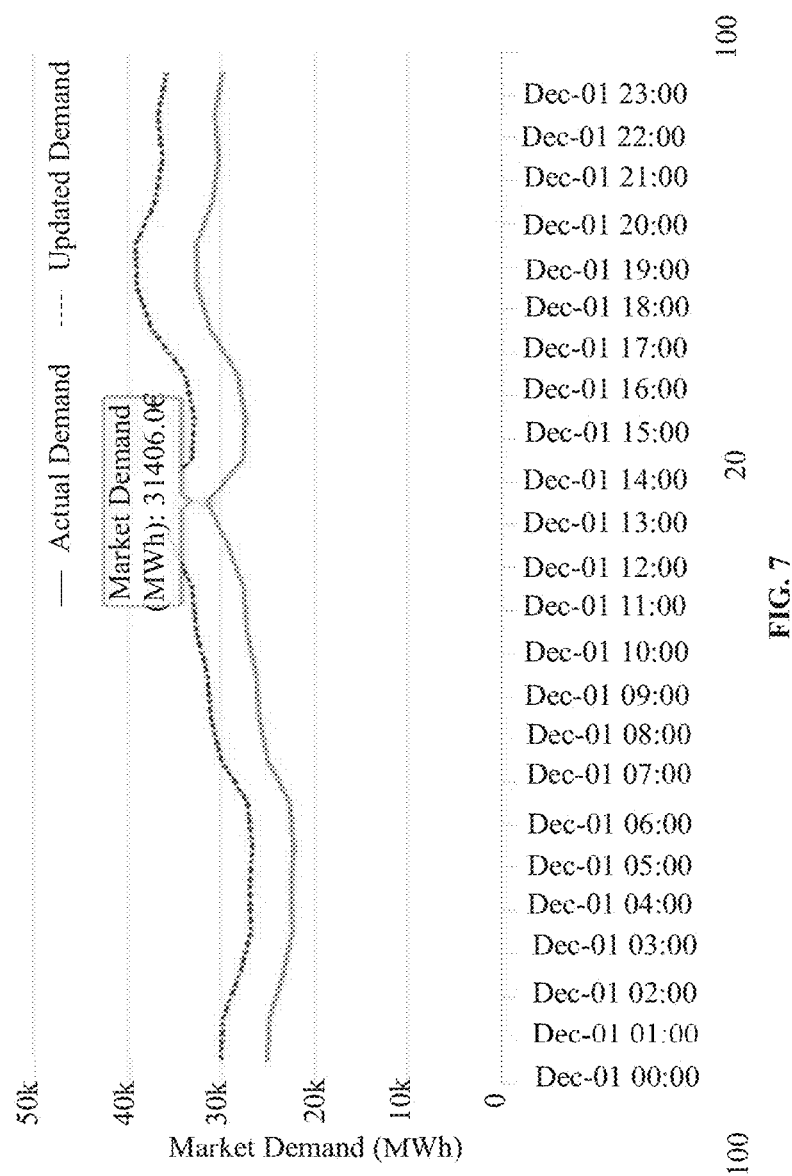
FIG. 7 illustrates a graph depicting a scenario setting demand variable for simulation of electricity value ecosystem using agent based modeling approach, in accordance with some embodiments of the present disclosure.

FIG. 7 illustrates a graph depicting a scenario setting demand variable for simulation of electricity value ecosystem using agent based modeling approach, in accordance with some embodiments of the present disclosure. It is shown in FIG. 7 that demand is increased by moving the slider to 20% setting. The dotted curve shown in FIG. 7 represents updated demand. This updated demand is utilized in subsequent steps of the simulation.

Figure 8A:
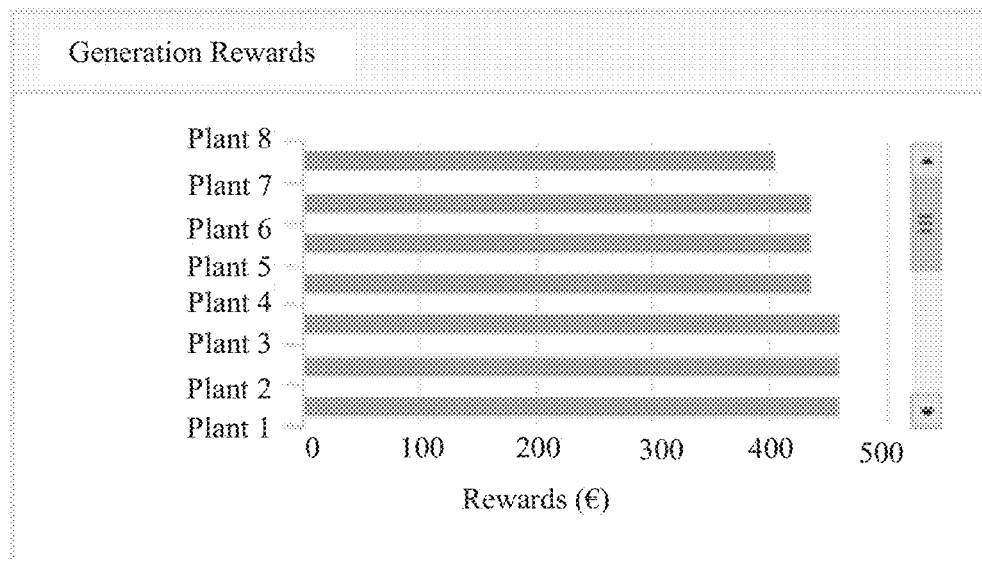
FIGS. 8A through 8F illustrate graphs depicting experimental results/outputs for simulation of electricity value ecosystem using agent based modeling approach, in accordance with some embodiments of the present disclosure.
Figure 8B:
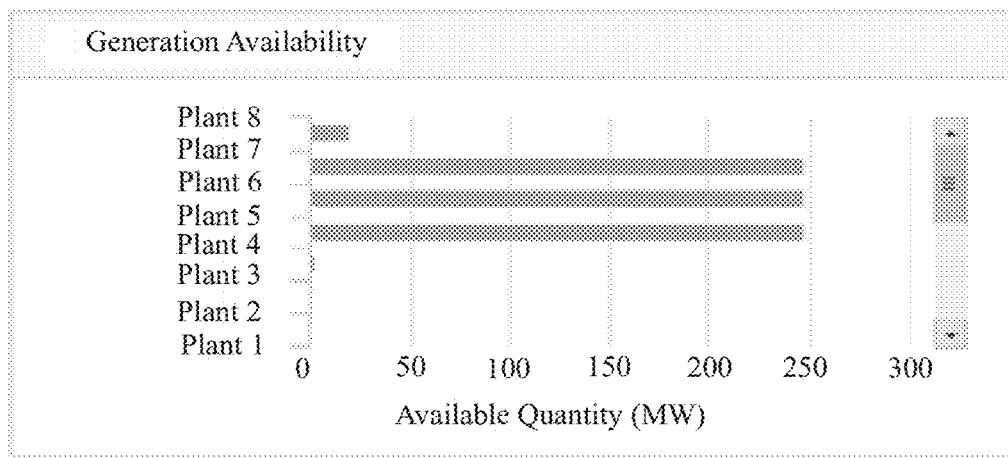
Figure 8C:
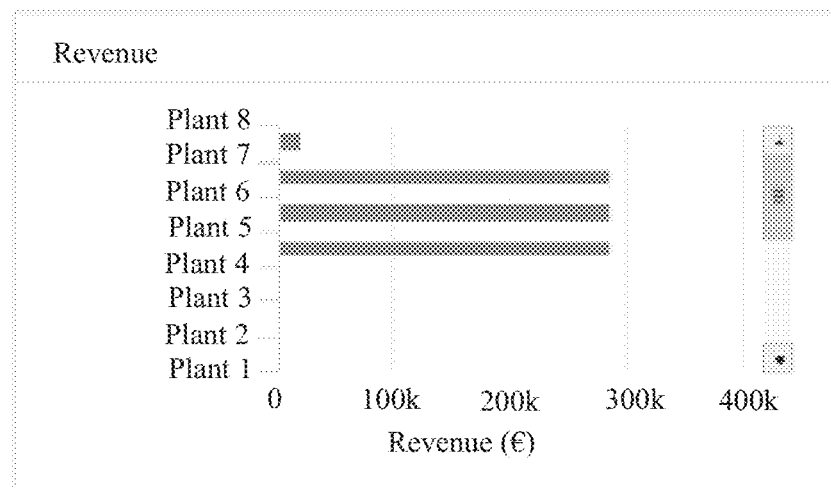
Figure 8D:
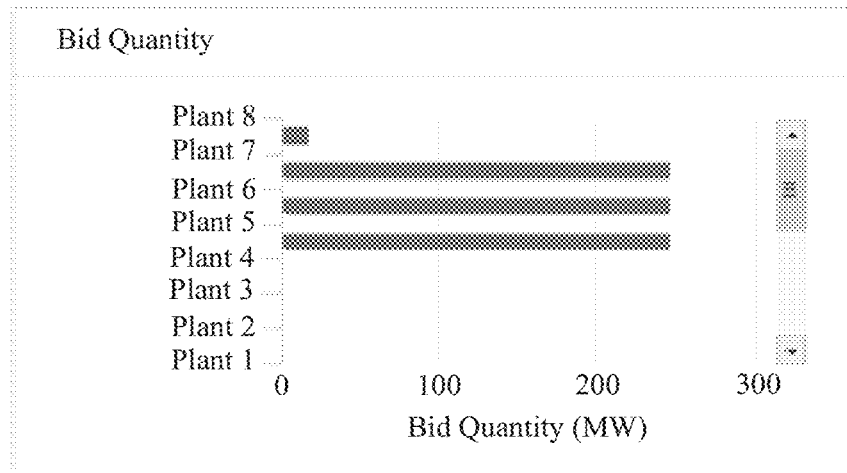
Figure 8E:
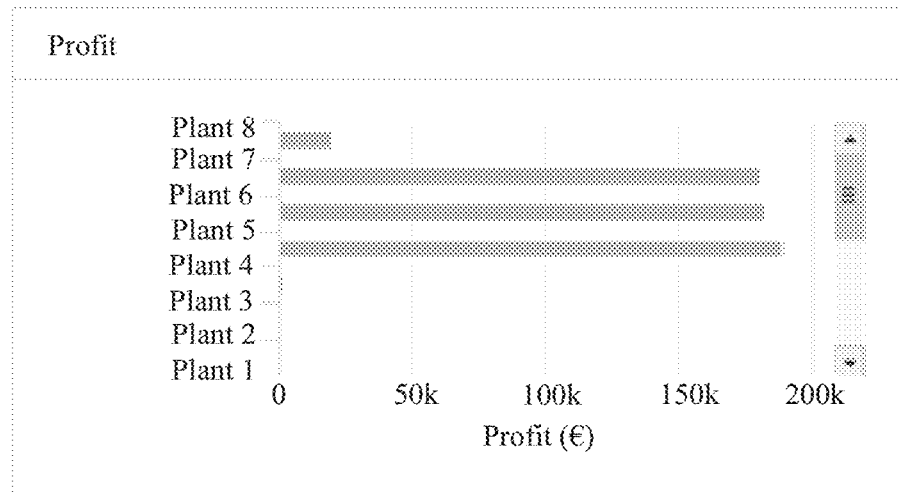
Figure 8F:
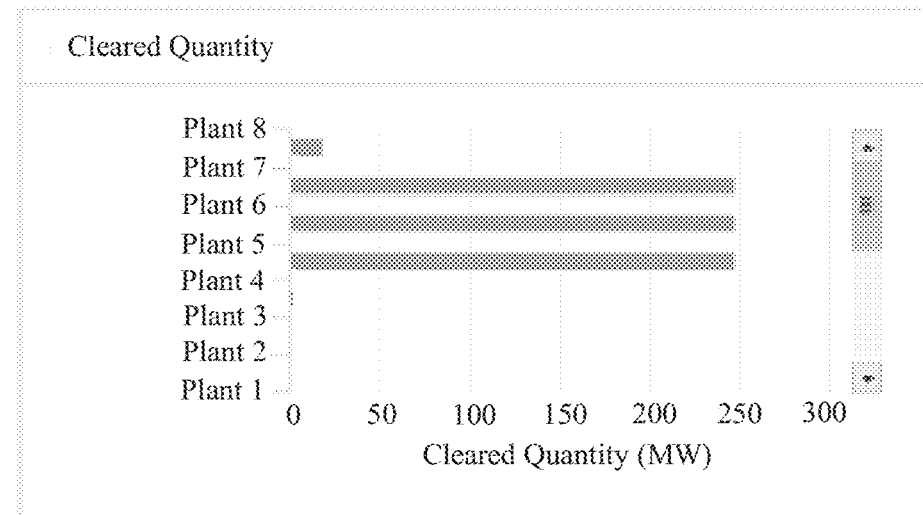

FIGS. 8A through 8F illustrate graphs depicting experimental results/outputs for simulation of electricity value ecosystem using agent based modeling approach, in accordance with some embodiments of the present disclosure. The graphs shown in FIGS. 8A through 8F represent different outputs of the simulation such as generation rewards, revenue, profit, generation availability, bid quantity, cleared quantity respectively for different generating plants of the company (Primary agent). These plants are listed on y-axis. The length of bar represents monetary values (e.g. revenue) or quantities (e.g. generation availability). For example, it is shown in FIG. 8B that revenue of plant 8 is lower than the plant 7 and so on.

Figure 9A:
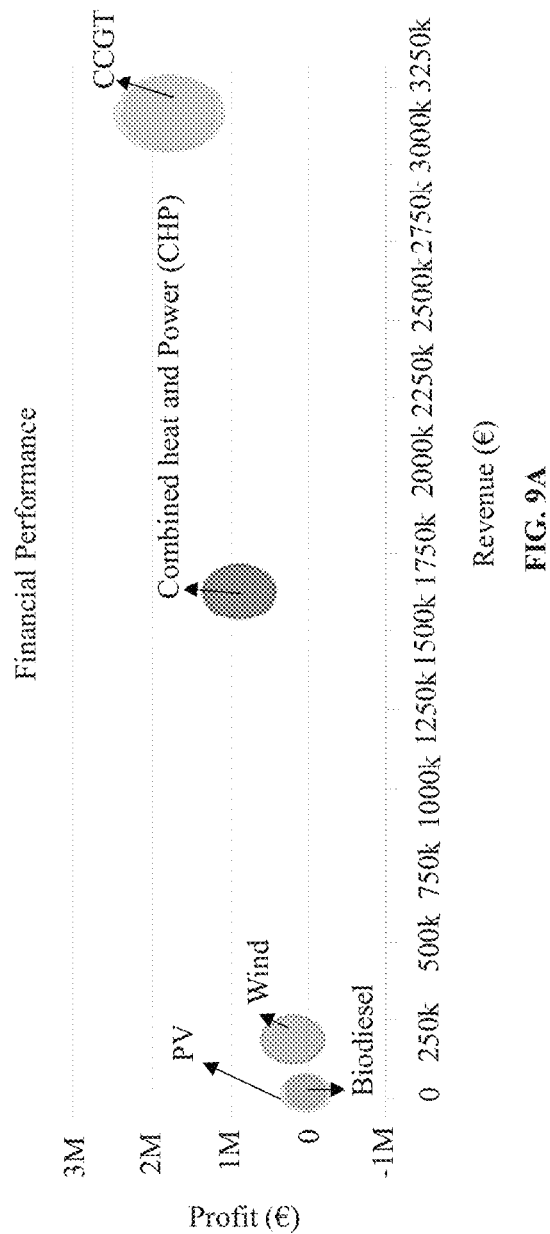
FIGS. 9A and 9B provide visualization of performance parameters for simulation of electricity value ecosystem using agent based modeling approach, in accordance with some embodiments of the present disclosure.
Figure 9B:
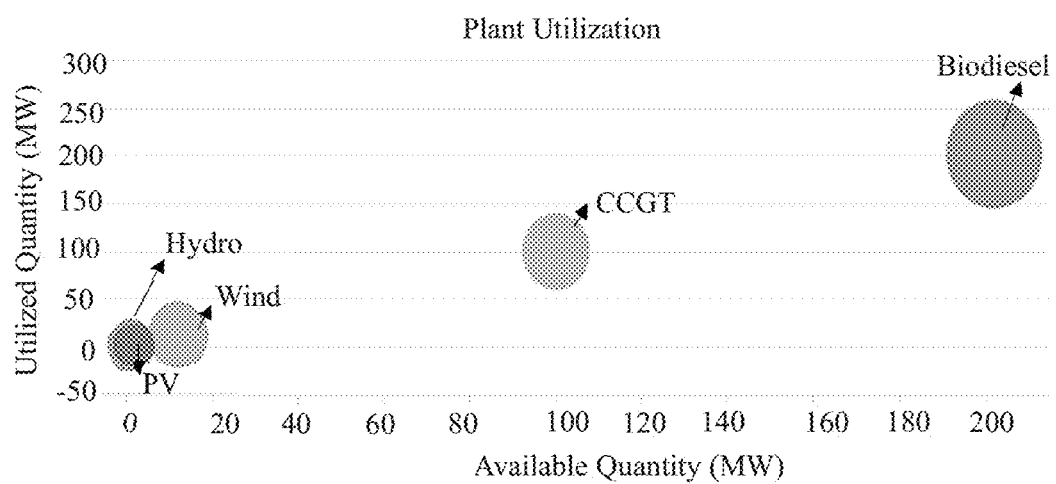

FIGS. 9A and 9B provide visualization of performance parameters for simulation of electricity value ecosystem using agent based modeling approach, in accordance with some embodiments of the present disclosure. FIG. 9A provides visualization of financial performance in terms of Revenue and Profit for primary agent in a simulation example. Here, size of bubbles represents the generation capacity of the generating plant. X-axis is revenue and y-axis is profit. It can be seen from FIG. 9A that for a combined cycle gas turbine (CCGT) generator shown by right most bubble, profit is highest and for photo voltaic (PV) and biodiesel generator shown as left most overlapping circles, the profit and revenue is smallest. FIG. 9B provides visualization of utilization of plant's available generation quantity (plant utilization) with respect to cleared (utilized) quantity in the electricity market. Visualizations provided in FIG. 5B provides insights on how each plant is getting clear in the market. Again here, size of a bubble represents generation capacity of the plant.

The present disclosure provides system and method for dynamic configurability of the electricity value ecosystem model by providing flexibility to dynamically add agents, entities, behaviors, and inter-relationships to the electricity value ecosystem design, where agents represent both stakeholders and assets. Further, an interactive studio for integrated simulations with user experience features is proposed which provide greater interaction such as conversational analytics. The present disclosure also provides decision support across breadth and depth of the electricity value ecosystem by aiding in decision-making not only for each agents in the electricity value ecosystem (e.g., Market, Generator), but also at various levels of the agent (e.g., strategic, tactical, operational). Further, the proposed system is enterprise ready with least friction for adoption which means existing investments in software or data or models are leveraged and easily integrated with enterprise systems, industry standards.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

It is to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g. hardware means like e.g. an application-specific integrated circuit (ASIC), a field-programmable gate array (FPGA), or a combination of hardware and software means, e.g. an ASIC and an FPGA, or at least one microprocessor and at least one memory with software modules located therein. Thus, the means can include both hardware means and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to, firmware, resident software, microcode, etc. The functions performed by various modules described herein may be implemented in other modules or combinations of other modules. For the purposes of this description, a computer-usable or computer readable medium can be any apparatus that can comprise, store, communicate, propagate, or transport the program for use by or in connection with the instruction execution system, apparatus, or device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated by the following claims.

What is claimed is:

1. A processor implemented method for simulation of an electricity value ecosystem using an agent based modelling approach, the method comprising:
providing a user interface to generate a causal diagram for a received user requirement of an electricity value ecosystem;
identifying a plurality of agents in the causal diagram, wherein the plurality of agents comprise a primary agent and one or more secondary agents interconnected with a plurality of edges to depict interdependencies between the plurality of agents;
performing at least one of:
(a) determining, using the agent based modeling approach, a plurality of processes associated with the plurality of edges and a plurality of models and processes for the plurality of agents, if corresponding models are present in a repository, wherein the plurality of models are updated using machine learning based models, the plurality of models being trained online to adopt dynamic behaviour of the electricity value eco-system; or
(b) generating one or more models if the corresponding models are absent in the repository, wherein the one or more models are generated based on dependencies and interactions of corresponding agent with other agents present in the causal diagram;
refining the causal diagram to vary one or more properties associated with the plurality of agents in accordance with one or more constraints; and
executing the plurality of processes associated with the refined causal diagram to provide a first set of outputs in accordance with the user requirement using default values of the one or more properties of the plurality of agents, wherein the default values of the one or more properties of the plurality of agents in the refined causal diagram are configurable to execute the plurality of processes in accordance with the configured values to provide a second set of outputs capturing cascading effect of impact of variation in the default values of the one or more properties of the plurality of agents.

2. The processor implemented method of claim 1, wherein one or more steps of each process associated with both of (i) the plurality of agents and (ii) the plurality of edges are executed in accordance with one or more predefined analytical tools.

3. The processor implemented method of claim 1, wherein the one or more constraints for refining the causal diagram include geography, market, network of interest or combinations thereof.

4. The processor implemented method of claim 1, wherein the impact of variation in the default values of the one or more properties of the plurality of agents is determined based on a topological sorted list of the plurality of agents identified in the refined causal diagram.

5. A system for simulation of an electricity value ecosystem using an agent based modelling approach, the system, comprising:
one or more data storage devices operatively coupled to one or more hardware processors and configured to store instructions configured for execution via the one or more hardware processors to:
provide a user interface to generate a causal diagram for a received user requirement of an electricity value ecosystem;
identify a plurality of agents in the causal diagram, wherein the plurality of agents comprise a primary agent and one or more secondary agents interconnected with a plurality of edges to depict interdependencies between the plurality of agents;
perform at least one of:
(a) determining, using the agent based modeling approach, a plurality of processes associated with the plurality of edges and a plurality of models and processes for the plurality of agents, if corresponding models are present in a repository, wherein the plurality of models are updated using machine learning based models, the plurality of models being trained online to adopt dynamic behaviour of the electricity value eco-system; or
(b) generating one or more models if the corresponding models are absent in the repository, wherein the one or more models are generated based on dependencies and interactions of corresponding agent with other agents present in the causal diagram;
refine the causal diagram to vary one or more properties associated with the plurality of agents in accordance with one or more constraints; and
execute the plurality of processes associated with the refined causal diagram to provide a first set of outputs in accordance with the user requirement using default values of the one or more properties of the plurality of agents, wherein the default values of the one or more properties of the plurality of agents in the refined causal diagram are configurable to execute the plurality of processes in accordance with the configured values to provide a second set of outputs capturing cascading effect of impact of variation in the default values of the one or more properties of the plurality of agents.

6. The system of claim 5, wherein one or more steps of each process associated with both of (i) the plurality of agents and (ii) the plurality of edges are executed in accordance with one or more predefined analytical tools.

7. The system of claim 5, wherein the one or more constraints for refining the causal diagram include geography, market, network of interest or combinations thereof.

8. The system of claim 5, wherein the impact of variation in the default values of the one or more properties of the plurality of agents is determined based on a topological sorted list of the plurality of agents identified in the refined causal diagram.

9. A computer program product comprising a non-transitory computer readable medium having a computer readable program embodied therein, wherein the computer readable program, when executed on a computing device, causes the computing device to:

provide a user interface to generate a causal diagram for a received user requirement of an electricity value ecosystem;

identify a plurality of agents in the causal diagram, wherein the plurality of agents comprise a primary agent and one or more secondary agents interconnected with a plurality of edges to depict interdependencies between the plurality of agents;

perform at least one of:
(a) determining, using an agent based modeling approach, a plurality of processes associated with the plurality of edges and a plurality of models and processes for the plurality of agents, if corresponding models are present in a repository, wherein the plurality of models are updated using machine learning based models, the plurality of models being trained online to adopt dynamic behaviour of the electricity value eco-system; or
(b) generating one or more models if the corresponding models are absent in the repository, wherein the one or more models are generated based on dependencies and interactions of corresponding agent with other agents present in the causal diagram;

refine the causal diagram to vary one or more properties associated with the plurality of agents in accordance with one or more constraints; and execute the plurality of processes associated with the refined causal diagram to provide a first set of outputs in accordance with the user requirement using default values of the one or more properties of the plurality of agents, wherein the default values of the one or more properties of the plurality of agents in the refined causal diagram are configurable to execute the plurality of processes in accordance with the configured values to provide a second set of outputs capturing cascading effect of impact of variation in the default values of the one or more properties of the plurality of agents.

10. The computer program product comprising the non-transitory computer readable medium of claim 9, wherein one or more steps of each process associated with both of (i) the plurality of agents and (ii) the plurality of edges are executed in accordance with one or more predefined analytical tools.

11. The computer program product comprising the non-transitory computer readable medium of claim 9, wherein the one or more constraints for refining the causal diagram include geography, market, network of interest or combinations thereof.

12. The computer program product comprising the non-transitory computer readable medium of claim 9, wherein the impact of variation in the default values of the one or more properties of the plurality of agents is determined based on a topological sorted list of the plurality of agents identified in the refined causal diagram.

* * * * *